(12) United States Patent
Kao et al.

(10) Patent No.: US 7,964,291 B2
(45) Date of Patent: *Jun. 21, 2011

(54) MAGNESIUM ALLOY COMPOUND TYPE THERMAL METAL MATERIAL

(75) Inventors: Ying Hung Kao, Tainan (TW); Emily Hsiao, Tainan (TW)

(73) Assignee: Jiing Tung Tec. Metal Co., Ltd., Tainan (TW)

( * ) Notice: Subject to any disclaimer, the term of this patent is extended or adjusted under 35 U.S.C. 154(b) by 960 days.

This patent is subject to a terminal disclaimer.

(21) Appl. No.: 11/892,806

(22) Filed: Aug. 27, 2007

(65) Prior Publication Data

US 2010/0203356 A1    Aug. 12, 2010

(51) Int. Cl.
*B32B 15/00* (2006.01)
*H05K 7/20* (2006.01)

(52) U.S. Cl. ........ 428/614; 428/649; 428/670; 428/672; 428/673; 361/709

(58) Field of Classification Search .................. None
See application file for complete search history.

(56) References Cited

U.S. PATENT DOCUMENTS

| | | | | |
|---|---|---|---|---|
| 2,023,498 A | * | 12/1935 | Winston | 228/158 |
| 4,135,290 A | * | 1/1979 | Evans, Jr. | 438/64 |
| 4,504,886 A | * | 3/1985 | Cygan et al. | 361/721 |
| 5,672,433 A | * | 9/1997 | Cook | 428/469 |
| 6,257,328 B1 | * | 7/2001 | Fujiwara et al. | 165/185 |
| 2002/0060062 A1 | * | 5/2002 | Nishikawa et al. | 164/428 |
| 2003/0051867 A1 | * | 3/2003 | Kennedy | 165/185 |
| 2004/0241447 A1 | * | 12/2004 | Fukushima | 428/408 |
| 2009/0117316 A1 | * | 5/2009 | Kao et al. | 428/66.6 |
| 2009/0176126 A1 | * | 7/2009 | Kao et al. | 428/649 |

FOREIGN PATENT DOCUMENTS

| | | | |
|---|---|---|---|
| JP | 2-152261 | * | 6/1990 |
| JP | 2002-119029 | * | 4/2002 |

* cited by examiner

*Primary Examiner* — John J Zimmerman
(74) *Attorney, Agent, or Firm* — Guice Patent PLLC (57) ABSTRACT

A magnesium alloy compound type thermal metal material includes a heat dissipation surface layer formed of a magnesium alloy, a contact surface layer formed of gold, platinum, silver, or copper alloy, and a fusion layer, which is an eutectic structure joined between the heat dissipation surface layer and the contact surface layer under and formed therebetween subject to application of a high temperature and a high pressure, such that the thermal conductivity metal alloy of the contact surface layer absorbs heat energy quickly from the heat source and transfers absorbed heat energy to the heat dissipation surface layer for quick dissipation; the internal molecules of the product are joined tightly together subject to the applied pressure, and the surface of the product allows for electroplating.

7 Claims, 7 Drawing Sheets

MAGNESIUM ALLOY COMPOUND TYPE THERMAL METAL MATERIAL

BACKGROUND OF THE INVENTION

1. Field of the Invention

The present invention relates to thermal conductivity materials and more particularly, to a magnesium alloy compound type thermal metal material formed by bonding a magnesium alloy and a thermal conductive gold, platinum, silver or copper alloy by means of stamping-forging or calendaring process, showing the best physical properties of magnesium and gold/platinum/silver/copper and having quick heat absorption and dissipation characteristics.

2. Description of the Related Art

The performance of a heat sink in an electronic product affects the service life of the electronic product. Conventional heat sinks are commonly extruded from aluminum. A heat sink extruded from aluminum does not provide satisfactory heat absorbing and dissipating effects. This old design of heat sink cannot meet the heat dissipation requirements of new generator electronic products. Nowadays, compound metal materials are developed for making heat sinks or the like. Taiwan Patent Publication Number 563846 discloses a compound type heat dissipation device, which comprises: a heat-transfer member, which comprises a thermal plate defining a thermal contact face for bridging a heat source, and a plurality of fins protruded from the thermal plate; and a heat dissipation member surrounding the fins of the heat transfer member to constitute a radiation fin having heat-transfer fins on the inside. The heat conduction of the heat-transfer member is better than the heat dissipation member. The heat dissipation efficiency of the heat dissipation member is superior to the heat-transfer member.

Regular commercial compound heat sinks may have different shapes, however they commonly use aluminum for the heat dissipation member and copper for the heat-transfer member for the reason that copper is an excellent heat conductive material, however the heat dissipation capability of copper is relatively lower than aluminum; aluminum has a relatively lower thermal conductivity but relatively higher heat dissipation capability. Therefore, aluminum and copper are intensively used together to make heat sinks. However, an aluminum copper compound type heat sink still cannot provide satisfactory heat dissipation and magnetic noise shielding effects.

Among light metals, magnesium alloy and aluminum alloy have the characteristics of high strength, high specific gravity, high rigidity, high impact resistant power, high wear resistant power, good reclaimability, and good magnetic noise shielding effect. Unlike aluminum alloy that has a long application history more than several centuries, magnesium is a new material widely studied for application in this latest decade. Most people in this industry are not familiar with the properties of magnesium. Further, it is complicated to use magnesium for making heat sinks. During processing of magnesium, magnesium may be burned out of caused to explode. Therefore, it is almost impossible to make heat sink from magnesium only. Because magnesium is a dangerous metal easy to react with oxygen, it may burn when melted and disposed in contact with oxygen. When burning magnesium is added with water, hydrogen will be produced to enhance the burning or even to cause explosion.

They are people trying to use magnesium alloy for making a heat sink. They commonly employ casting and semi-solid injection to shape the product. Because magnesium has a low flow index, it is difficult to make a thin sheet member from magnesium by casting, and the yield rate will be low. Fabrication of a heat sink from magnesium by casting may encounter the problems of thermal crack, oxidation, flown line, low strength, and deformation upon stripping from mold. Further, low tightness is another problem that affects heat dissipation performance.

SUMMARY OF THE INVENTION

After through a number of tests on various forging metals such as gold, silver, copper, aluminum, magnesium, etc. that are commonly used in metal processing industry, we found that forged magnesium alloy has its crystallographic density changed when forged under a high pressure, showing a better performance in annealing, i.e., when the material is compressed by an external pressure, the even and tight crystallographic structure thus obtained improves heat transfer and dissipation effects.

It is the main object of the present invention to provide a magnesium alloy compound type thermal metal material, which is formed of a magnesium alloy and a thermal conductive gold, platinum, silver or copper alloy by means of stamping-forging or calendaring process, showing the best physical properties of magnesium and gold/platinum/silver/copper and having quick heat absorption and dissipation characteristics.

To achieve this and other objects of the present invention, the magnesium alloy compound type thermal metal material comprises a heat dissipation surface layer formed of a magnesium alloy; a contact surface layer formed of a thermal conductivity metal alloy prepared from one of the materials including gold, platinum, silver, and copper, said contact surface layer having a depth thickness forced into said heat dissipation surface layer by stamping-forging; and a fusion layer joined between said heat dissipation surface layer and said contact surface layer, said fusion layer being an eutectic structure formed of said heat dissipation surface layer and said contact surface layer under the application of a high temperature and a high pressure; such that the thermal conductivity metal alloy of said contact surface layer absorbs heat energy quickly from a heat source and transfers absorbed heat energy to said heat dissipation surface layer for quick dissipation; the internal molecules of the product are joined tightly together subject to the applied pressure, and the surface of the product allows for electroplating.

DETAILED DESCRIPTION OF THE PREFERRED EMBODIMENT

Figure 1:
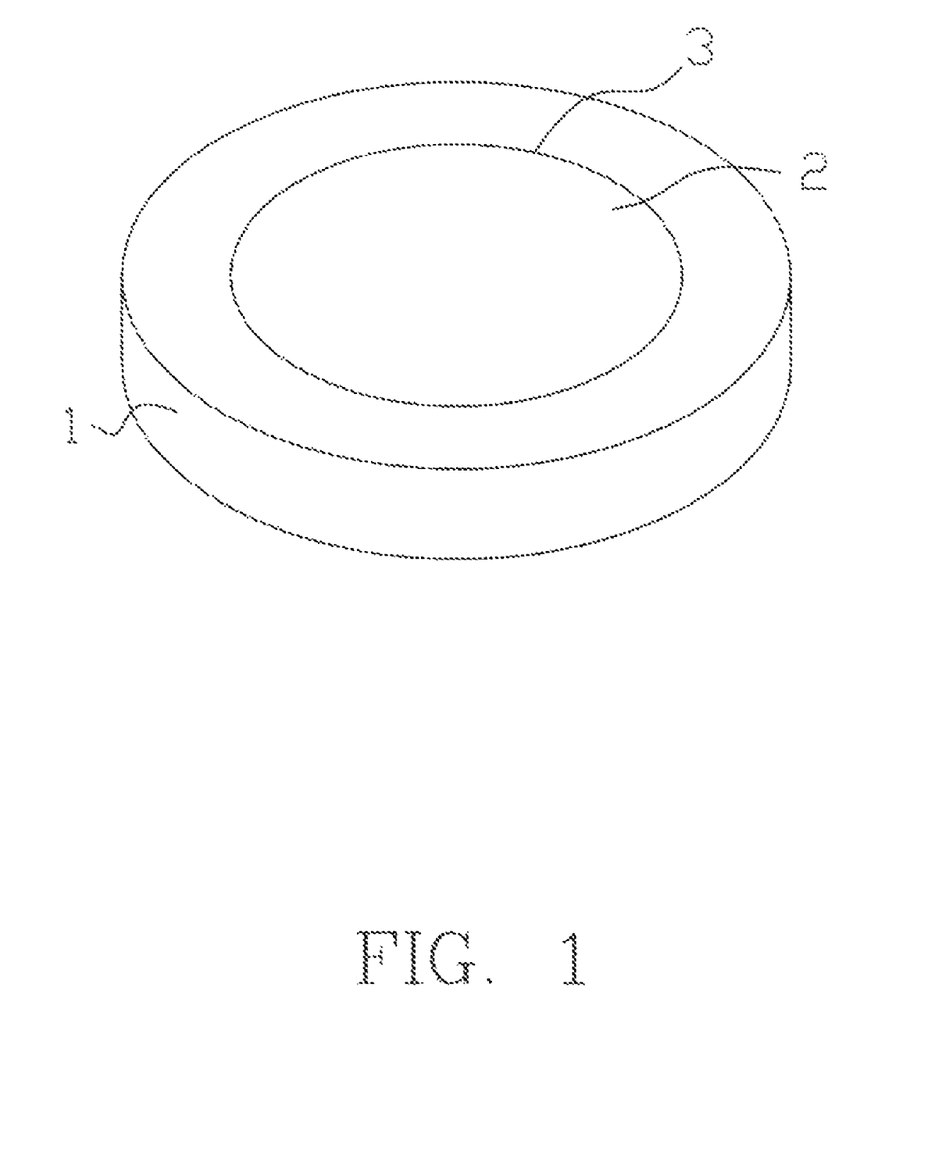
FIG. 1 is an elevational view of a magnesium alloy compound type thermal metal material in accordance with the present invention.
Figure 2:
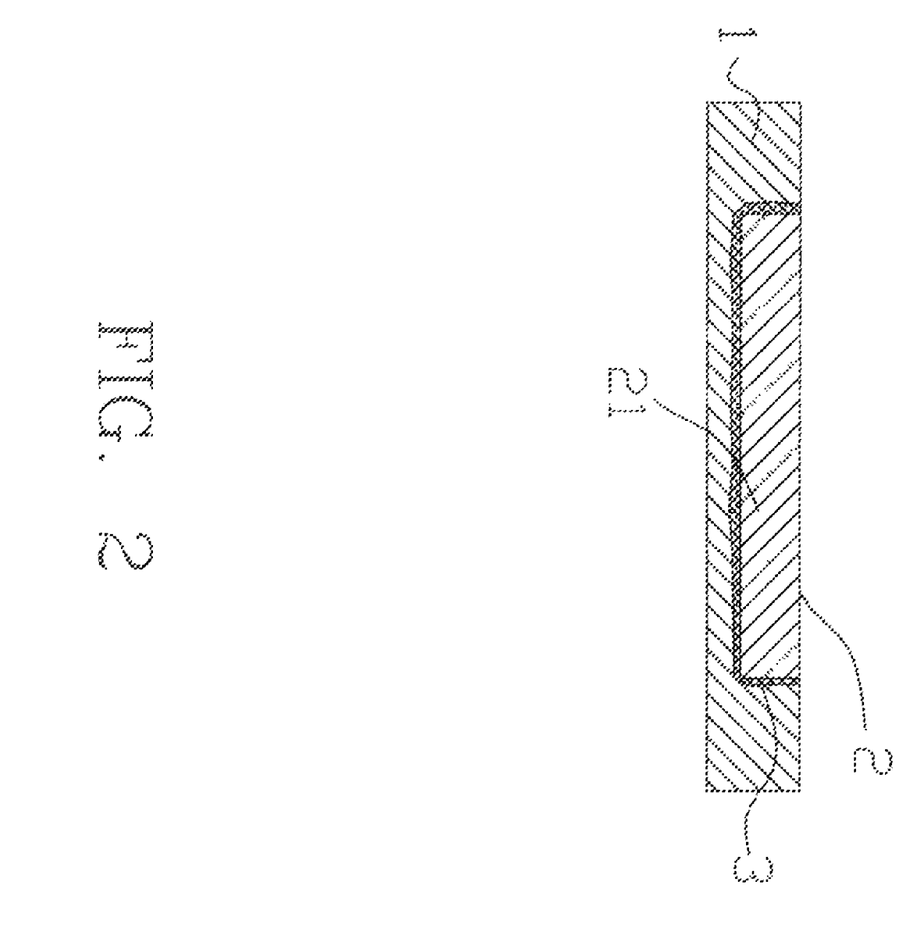
FIG. 2 is a sectional view of the magnesium alloy compound type thermal metal material in accordance with the present invention.

Referring to FIGS. 1 and 2, a magnesium alloy compound type thermal metal material in accordance with the present invention is shown comprising:

a heat dissipation surface layer 1, which is formed of a magnesium alloy;

a contact surface layer 2, which is formed of a high thermal conductivity metal alloy prepared from gold, platinum, silver, or copper; and a fusion layer 3 joined between the heat dissipation surface 1 and the contact surface layer 2.

The fusion layer 3 is a eutectic structure formed of a part the heat dissipation surface layer 1 and a part of the contact surface layer 2 under the application of a high temperature and a high pressure.

Figure 4:
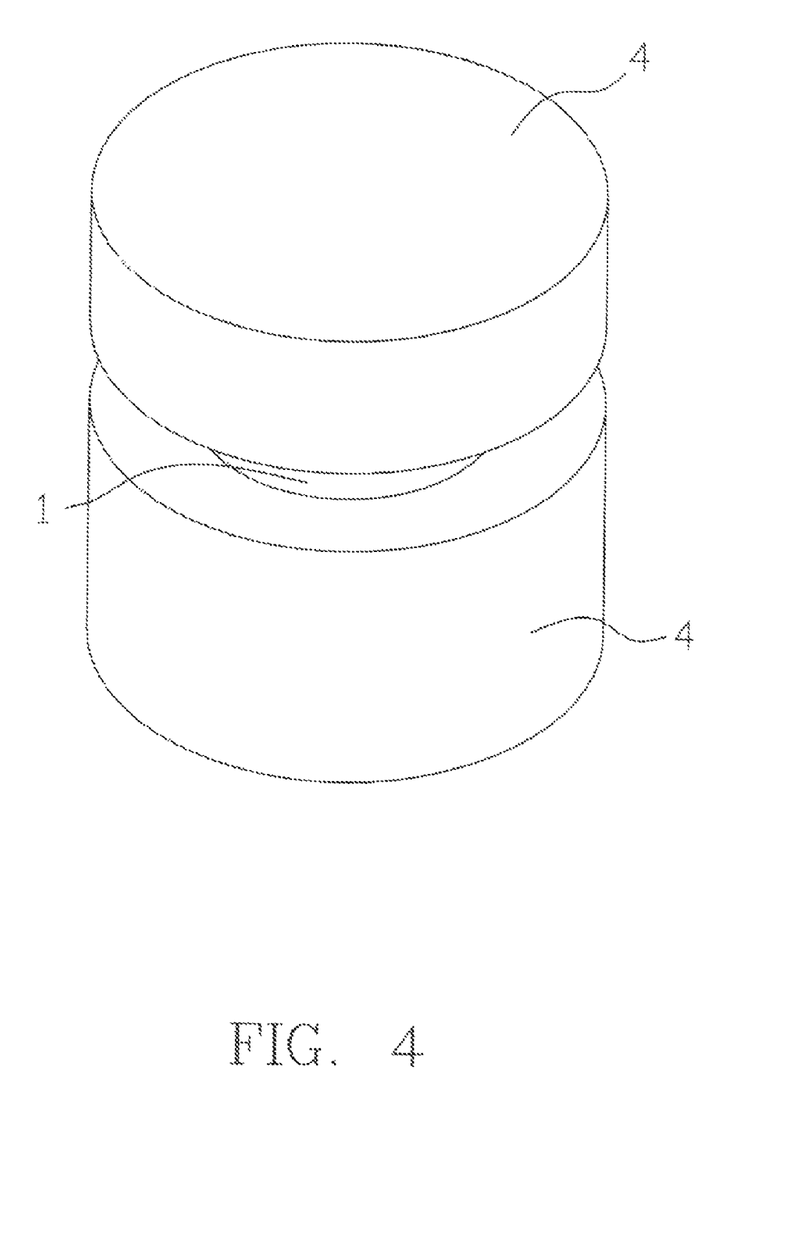
FIG. 4 corresponds to FIG. 3, showing the materials compressed in the mold
Figure 5:
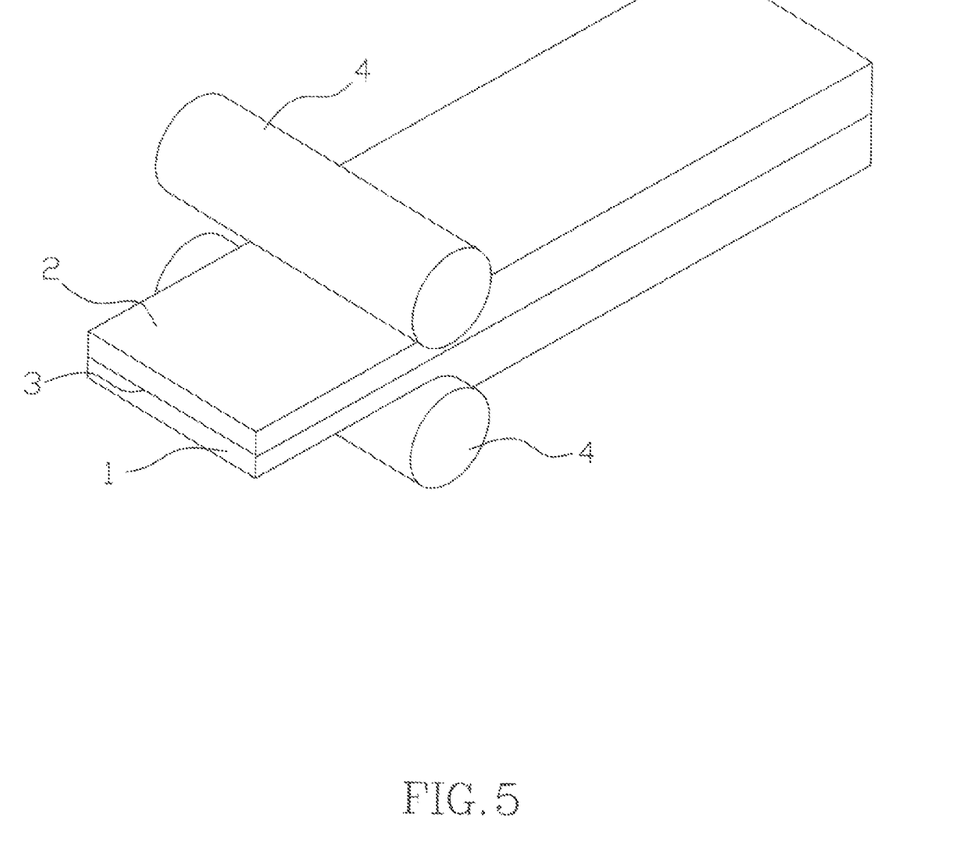
FIG. 5 is a schematic drawing showing the application of a calendaring process during the fabrication of a magnesium alloy compound type thermal metal material according to the present invention.

The processing of the magnesium alloy compound type thermal metal material can be done by means of stamping or forging process (see FIGS. 3 and 4) or calendering process (see FIG. 5). To have the two different metal materials of the heat dissipation surface layer 1 and contact surface layer 2 be effectively bonded together, the best fabrication parameters can be obtained subject to the desired product structure and size through computer simulation 5 before fabrication, and then compressed through a temperature controllable mold 4.

Figure 6:
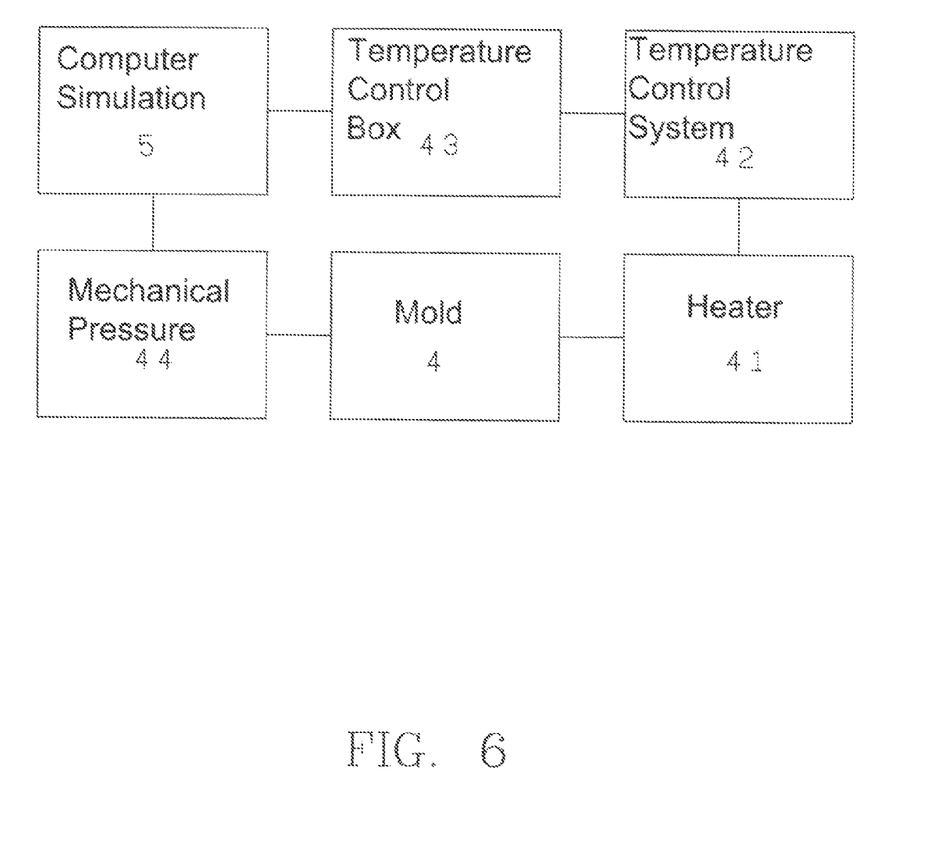
FIG. 6 is a manufacturing block diagram of the present invention.

Referring to FIG. 6, the computer simulation 5 is the so-called "mold flow analysis". According to this computer simulation 5, the mold chart designed subject to the shape of the product to be fabricated and the predetermined metal blank chart are put in the computer files, and metal material characteristic parameters and relevant experience parameters are inputted into models to simulate the filling and flowing of materials in the mold 4 for predicting precisely temperature, speed, pressure, time, and etc., so as to achieve the most desirable molding conditions. The result of this mold flow analysis is used to improve the design of the product and the mold as well as shorten the development cycle of the product and the mold.

Figure 3:
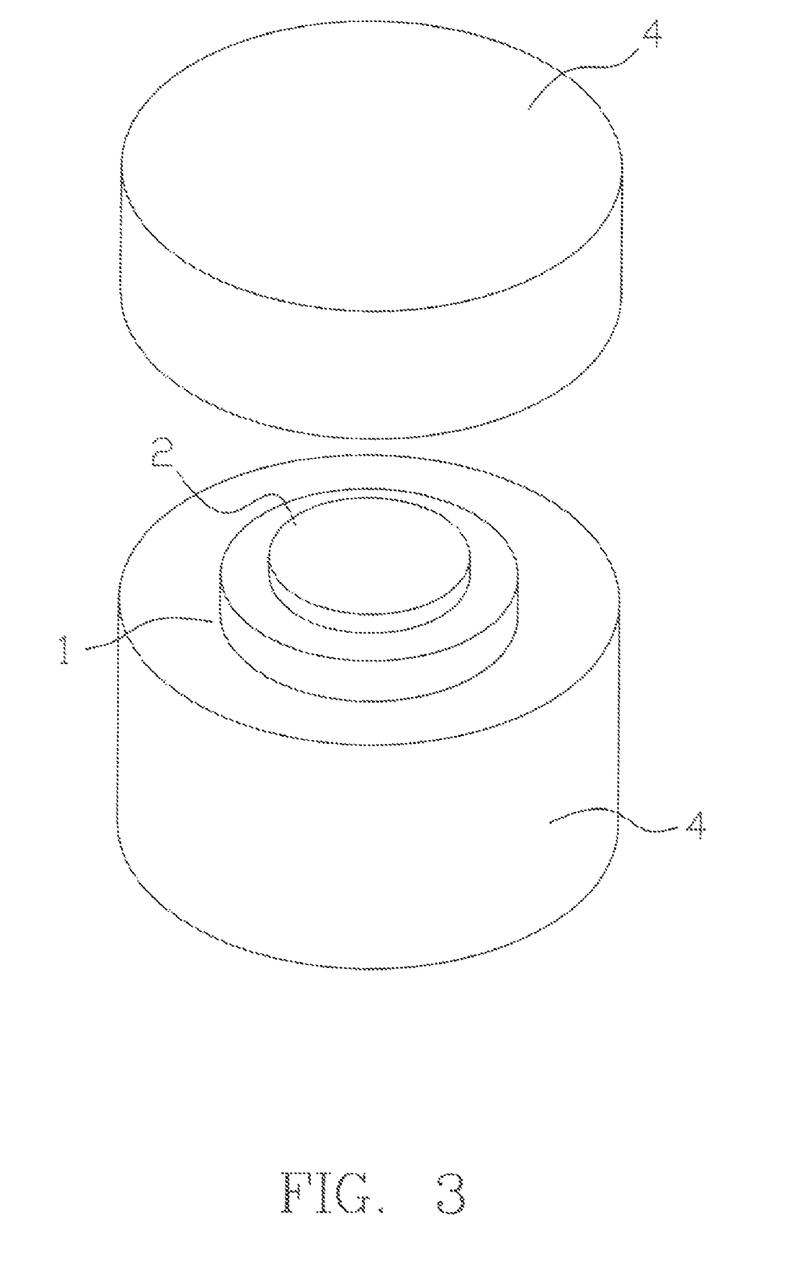
FIG. 3 is a schematic drawing showing the materials to be processed put in a mold according to the present invention.

During fabrication, the temperature control of the mold 4 is achieved by means of: embedding a heater 41 in the mold 4 and using a temperature control system 42 in a temperature control box 43 to control the operation of the heater 41 in the mold 4. When use in use, the desired temperature value is inputted into the temperature control box 43, enabling the temperature control system 42 to control the operation of the heater 41 in the mold 4, and therefore the temperature of the mold 4 is controlled within the set temperature range. During fabrication, the semi-finished product of magnesium alloy and copper alloy is heated to a predetermined temperature level and softened, and then a mechanical pressure 44 is applied to the mold 4 subject to the data obtained from the aforesaid computer simulation 5. In case stamping or forging process is employed, the contact layer 2 will be compressed into the heat dissipation surface layer 1 to provide a thickness in depth 21 about 0.5~10 mm.

There is another important factor during fabrication of the present invention. As it is known that magnesium is inflammable. The burning point of magnesium is about 600° C. To produce the fusing layer 3 between the two different metal materials, the heating temperature employed to the magnesium alloy cannot be too high. Preferably, the heating temperature to be employed to the magnesium alloy is controlled within 200° C.~350° C. The heating temperature to be employed to the copper alloy is preferably controlled within 200° C.~800° C. When the magnesium alloy and the copper alloy are softened, they are compressed in the mold 4 to force the copper alloy into the magnesium alloy. When forcing the copper alloy into the magnesium alloy, thermal energy is transferred from the copper alloy to the magnesium alloy to increase the temperature of the magnesium alloy, and therefore the magnesium alloy and the copper alloy are bonded together. Because this heating control is done subject to the result of the computer simulation 5, the fabrication is accurately controlled, preventing burning of the magnesium alloy and assuring safety.

A magnesium alloy compound type thermal metal material made according to the present invention is practical for use to dissipate heat from a heat source. During application, the contact surface layer 2 is attached to the heat source to absorb heat energy from the heat source, and the fusion layer 3 quickly transfers absorbed heat energy from the contact surface layer 2 to the magnesium alloy heat dissipation surface layer 1 for quick dissipation.

In the aforesaid many different processing methods, a magnesium alloy compound type thermal metal material made by forging shows the best performance in heat dissipation. Forging greatly compacts the structure of the metal product for quick heat energy absorption and dissipation. Compression pressure during forging compacts the molecules of the structure. Therefore, the product made by forging is protective against water to facilitate electroplating. By means of conventional techniques, the heat dissipation surface of the product can easily be covered with a coating layer (not shown) to make the product loop beautiful.

Figure 7:
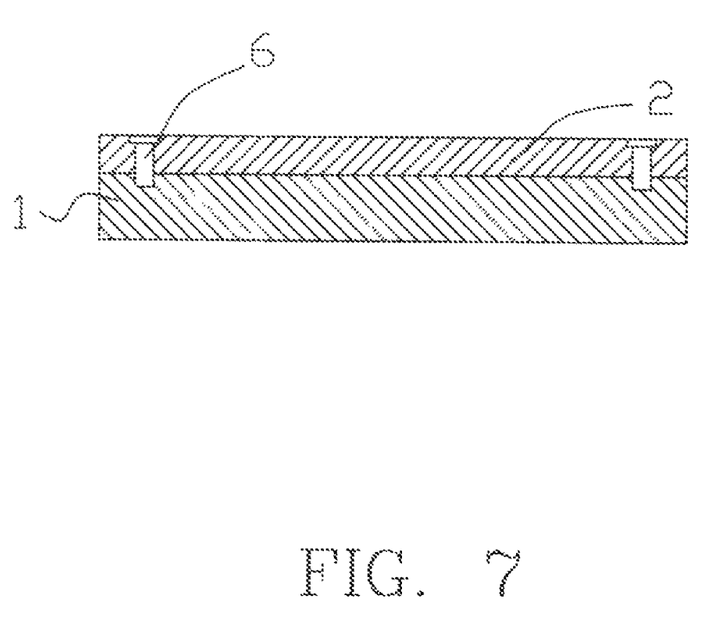
FIG. 7 is a schematic sectional view showing the assembly of a magnesium alloy compound type thermal metal material with fastening members according to the present invention.

Referring to FIG. 7, fastening members 6 such as rivets, screw nails, snaps, or the like may be used to affix the contact surface layer 2 and the heat dissipation surface layer 1 together. A product made according to this method also has quick heat absorption and dissipation characteristics.

In general, the invention can be used in any product that requires quick dissipation of heat for the advantages as follows:

1. Magnesium has thermal radiation and low thermal residue characteristics, and is the best thermal metal for heat dissipation. When bonded with copper alloy, internal heat convection greatly improves the heat dissipation performance of the product. Therefore, the product of the present invention is superior to conventional aluminum copper alloy design in heat dissipation.

2. The high-performance magnesium alloy compound type thermal metal material prolongs the working life of the heat source and enhances its performance. Because magnesium has the characteristic of hyperplasticity characteristic, the high-performance magnesium alloy compound type thermal metal material can be forged to show a complicated shape design. Further, the lightweight characteristic of magnesium enables the product of the present invention to have a lightweight feature, 3. The magnesium alloy compound type thermal metal material can be made by forging to provide a high strength. When compared with conventional designs made by casting or extrusion, the invention shows over 20% better in heat conducting and dissipating performance.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A magnesium alloy compound thermal metal material comprising:

a heat dissipation surface layer formed of a magnesium alloy;

a contact surface layer formed of a thermal conductivity metal alloy prepared from a material selected from a group consisting of gold, platinum, silver, and copper, said contact surface layer having a depth thickness forced into said heat dissipation surface layer by stamping-forging; and a fusion layer joined between said heat dissipation surface layer and said contact surface layer, said fusion layer being an eutectic structure formed of said heat dissipation surface layer and said contact surface layer under the application of a high temperature and a high pressure;

such that the thermal conductivity metal alloy of said contact surface layer absorbs heat energy quickly from a heat source and transfers absorbed heat energy to said heat dissipation surface layer for quick dissipation; the internal molecules of the product are joined tightly together subject to the applied pressure, and the surface of the product allows for electroplating.

2. The magnesium alloy compound thermal metal material as claimed in claim 1, wherein the depth thickness of said contact surface layer is within 0.5~10 mm.

3. The magnesium alloy compound thermal metal material as claimed in claim 1, wherein said contact surface layer is formed of copper alloy; the copper alloy of said contact surface layer is heated to 200~350° C. and the magnesium alloy of said heat dissipation surface layer is heated to 200~800° C. when said contact surface layer has been forced into said heat dissipation surface layer to form said eutectic structure of said fusion layer between said contact surface layer and said heat dissipation surface layer for enabling said eutectic structure of said fusion layer to exchange heat between said contact surface layer and said heat dissipation surface layer.

4. The magnesium alloy compound thermal metal material as claimed in claim 1, wherein said heat dissipation surface layer has an outer surface thereof covered with an electroplate coating.

5. A magnesium alloy compound thermal metal material comprising:

a heat dissipation surface layer formed of a magnesium alloy;

a contact surface layer formed of a thermal conductivity metal alloy prepared from a material selected from a group consisting of gold, platinum, silver, and copper, and bonded to said heat dissipation surface layer by calendering; and a fusion layer joined between said heat dissipation surface layer and said contact surface layer, said fusion layer being an eutectic structure formed of said heat dissipation surface layer and said contact surface layer under the application of a high temperature and a high pressure;

such that the thermal conductivity metal alloy of said contact surface layer absorbs heat energy quickly from a heat source and transfers absorbed heat energy to said heat dissipation surface layer for quick dissipation; the internal molecules of the product are joined tightly together subject to the applied pressure, and the surface of the product allows for electroplating.

6. The magnesium alloy compound thermal metal material as claimed in claim 5, wherein said contact surface layer is formed of copper alloy; the copper alloy of said contact surface layer is heated to 200~350° C. and the magnesium alloy of said heat dissipation surface layer is heated to 200~800° C. when said contact surface layer has been forced into said heat dissipation surface layer to form said eutectic structure of said fusion layer between said contact surface layer and said heat dissipation surface layer for enabling said eutectic structure of said fusion layer to exchange heat between said contact surface layer and said heat dissipation surface layer.

7. The magnesium alloy compound thermal metal material as claimed in claim 5, wherein said heat dissipation surface layer has an outer surface thereof covered with an electroplate coating.

* * * * *